(12) United States Patent
Mikagi

(10) Patent No.: US 6,274,932 B1
(45) Date of Patent: Aug. 14, 2001

(54) SEMICONDUCTOR DEVICE HAVING METAL INTERCONNECTION COMPRISING METAL SILICIDE AND FOUR CONDUCTIVE LAYERS

(75) Inventor: Kaoru Mikagi, Tokyo (JP)

(73) Assignee: NEC Corporation, Tokyo (JP)

( * ) Notice: Subject to any disclaimer, the term of this patent is extended or adjusted under 35 U.S.C. 154(b) by 943 days.

(21) Appl. No.: 08/520,003

(22) Filed: Aug. 28, 1995

(30) Foreign Application Priority Data

Aug. 30, 1994 (JP) .................................................. 6-228781

(51) Int. Cl.[7] ........................ H01L 29/45; H01L 21/4763; H01L 21/441
(52) U.S. Cl. ...................... 257/754; 438/643; 438/644; 438/645; 438/649; 438/655
(58) Field of Search ...................... 257/754, 750

(56) References Cited

U.S. PATENT DOCUMENTS

| 4,789,648 | 12/1988 | Chow et al. ............................ 437/225 |
| 4,944,836 | 7/1990 | Beyer et al. ......................... 156/645.1 |
| 5,371,410 | * 12/1994 | Chen et al. ........................... 257/750 |
| 5,384,485 | * 1/1995 | Nishida et al. ....................... 257/754 |

FOREIGN PATENT DOCUMENTS

| 62-241373 | * 10/1987 | (JP) ..................................... 257/754 |
| 63-207153 | 8/1988 | (JP) . |
| 2-278827 | * 11/1990 | (JP) ..................................... 257/750 |

OTHER PUBLICATIONS

"Planar Copper–Polyimide Back End of the Line Interconnections for ULSI Devices," B. Luther et al., 1993 Proceedings Tenth Internat'l. VLSI Multilevel Interconnection Conference, Santa Clara, CA, pp. 15–21, Jun. 8 and 9, 1993.

* cited by examiner

Primary Examiner—Olik Chaudhuri
Assistant Examiner—Nathan Ha
(74) Attorney, Agent, or Firm—Sughrue, Mion, Zinn, Macpeak & Seas, PLLC

(57) ABSTRACT

A semiconductor device having a metal interconnection includes an insulating film provided on a semiconductor substrate via a diffusion layer. An interlayer contact hole is formed in the insulating film. A metal silicide layer is provided at the bottom of the interlayer contact hole. A first conductive film comprises a single or a plurality of metal films provided on the insulating film and the interlayer contact hole. A second conductive film is provided in the interlayer contact hole. A third conductive film is provided on the first conductive film and the second conductive film. A fourth conductive film is provided on the third conductive film. This semiconductor device has improved durability with respect to electromigration or stress migration. Even when the interconnection has a multilevel structure, the contact resistance can be reduced by causing the interlayer contact hole portions to contact one another by the same kind of metal.

14 Claims, 6 Drawing Sheets

SEMICONDUCTOR DEVICE HAVING METAL INTERCONNECTION COMPRISING METAL SILICIDE AND FOUR CONDUCTIVE LAYERS

BACKGROUND OF THE INVENTION

1. Field of the Invention

The present invention relates to a semiconductor device having a metal interconnection.

2. Description of the Related Art

Some of known conventional semiconductor devices are disclosed in U.S. patent application Ser. Nos. 4,789,648 and 4,944,836. The first conventional semiconductor device will be described with reference to FIGS. 1A and 1B and the second conventional semiconductor device will be described with reference to FIGS. 2A to 2E.

(a) First Conventional Semiconductor Devices

First, the semiconductor device described in U.S. patent application Ser. No. 4,789,648 (hereinafter called the "first prior art example") will be discussed with reference to FIGS. 1A and 1B. FIGS. 1A and 1B are vertical crosssectional views illustrating the fabrication process for this semiconductor device (first prior art example) consisting of steps 1A and 1B.

According to the first prior art example, as shown in FIG. 1A, an insulating film 104a as a silicon dioxide film is formed on a silicon substrate 101 by chemical vapor deposition (hereinafter referred as CVD) or the like, a groove pattern is formed by known techniques, and then an aluminum film (Al film) 114 as a conductive film is formed by sputtering.

At this time, the thickness of the insulating film 104a is set equal to the thickness of the necessary interconnection film plus the thickness of the conductive film. A silicon nitride which serves as a stopper at the later step of polishing the metal film may be formed on the insulating film 104a.

Subsequently, the Al film 114 is polished and removed by chemical-mechanical polishing (hereinafter called "CMP") using a slurry consisting of alumina ($Al_2O_3$)-added deionized water or an $Al_2O_3$-added nitrate solution, yielding a groove interconnection structure which has a groove pattern filled with an interconnection material (Al film 114), as shown in FIG. 1B.

(b) Second Conventional Semiconductor Devices

Next, the semiconductor device described in U.S. patent application Ser. No. 4,944,836 (hereinafter called the "second prior art example") will be discussed with reference to FIGS. 2A to 2E. FIGS. 2A–2E are vertical cross-sectional views illustrating the fabrication process for this semiconductor device (second prior art example) consisting of steps A to E.

According to the second prior art example, as shown in FIG. 2A, an insulating film 104a and an underlying Al interconnection 112 are formed using known techniques, an insulating film 104b (which may be a silicon dioxide film) is formed on the surface of the resultant structure, and a stopper 113 of $Al_2O_3$ is then formed in a predetermined region by lithography, etching and the like.

Then, an insulating film 104c as a silicon dioxide film is formed on the stopper 113 and the insulating film 104b, as shown in FIG. 2B.

Next, as shown in FIG. 2C, the insulating film 104c and insulating film 104b are patterned by selective etching using a resist (not shown) as a mask to form an interlayer contact hole 105 which reaches the underlying Al interconnection 112.

As the stopper 113 is not etched at this time, only that portion of the insulating film 104b which lies under the opening of the stopper 113 is removed.

Subsequently, an Al film 114 is formed on the entire surface as shown in FIG. 2D by a known method like sputtering.

Then, the Al film 114 is polished and removed by CMP, yielding a groove interconnection structure which has the Al-filled interlayer contact hole 105 and an Al-filled groove pattern, as shown in FIG. 2E.

(c) Third Conventional Semiconductor Devices

Another known conventional semiconductor device is described in "Proceedings of 1993 VLSI Multilevel Interconnection Conference, pp. 15–21 (1993)" (hereinafter called the "third prior art example"). This third prior art example will now be discussed with reference to FIGS. 3A to 3E, which are vertical cross-sectional views illustrating the fabrication process for this example.

According to the third prior art example, as shown in FIG. 3A, first, an insulating film 104a of PI 5180 (polyimide resin) is formed 500 to 1000 nm thick on a silicon substrate 101 by rotational coating.

Next, a stopper 113 is formed of a silicon nitride film on the top of this insulating film 104a by a plasma CVD technique.

Then, a photoresist 116 to be an etching mask is formed in a predetermined region as shown in FIG. 3B using a lithography technique.

As shown in FIG. 3C, the stopper 113 and the insulating film 104a are etched by reactive ion etching using this photoresist 114 as a mask, forming a groove pattern for interconnection. Then, the photoresist 116 is removed.

Next, as shown in FIG. 3D, a tantalum film (Ta film) 106a is formed by sputtering, followed by the formation of a copper film (Cu film) 109a on the Ta film 106a to bury the interconnection groove pattern.

Then, as shown in FIG. 3E, the Cu film 109a and the Ta film 106a are removed by a known CMP process called "Damascene process " in such a way that the Cu film 109a and Ta film 106a remain only inside the interconnection groove pattern. At this time, the stopper 113 serves as a stopper layer in the polishing step because the polishing speed of the stopper 113 on the insulating film 104a is slower than those of the Cu film 109a and Ta film 106a.

According to the third prior art example, a semiconductor device having an interconnection whose main conductive layer is made of Cu is fabricated through those steps A to E.

(d) Fourth Conventional Semiconductor Devices

A further known conventional semiconductor device is described in Unexamined Japanese Patent Publication No. Sho 63-207153 (hereinafter called the "fourth prior art example"). This example will now be discussed with reference to FIGS. 4A to 4F which are vertical cross-sectional views illustrating the fabrication process consisting of steps 4A to 4B.

According to the fourth prior art example, as shown in FIG. 4A, an insulating film 104a constituted of a silicon dioxide film is formed on a silicon substrate (not shown).

Subsequently, an underlying Al interconnection 112 of 1.0 $\mu$m in thickness is formed using a known technique, and an insulating film 104b constituted of a PSG film with a thickness of 1.0 to 1.5 $\mu$m is formed on the entire surface of the resultant structure.

Then, an upper lying Al interconnection 115 having a thickness of 1.0 $\mu$m is formed on the insulating film 104b as shown in FIG. 4B.

Next, as shown in FIG. 4C, a stopper 113 made of a silicon nitride film of 200 nm thick is formed on the entire surface of the resultant structure by a plasma CVD technique.

Subsequently, the stopper 113, the upper lying Al interconnection 115 and the insulating film 104b are partially removed using a resist (not shown) as an etching mask to form an interlayer contact hole 105 in the portion where the underlying Al interconnection 112 crosses the upper lying Al interconnection 115, as shown in FIG. 4D.

Single positioning is sufficient for opening this hole, and the opening need not be made particularly narrow and should have a diameter about the same as the widths of those interconnections. Therefore, the precision of the positioning need not be particularly high.

Next, an Al film 114 is formed 2000 to 3000 nm thick by downflow vapor deposition, as shown in FIG. 4E.

Then, the Al film 114 on the stopper 113 is polished out, yielding a structure with the Al film 114 buried in the interlayer contact hole 105, as shown in FIG. 4F.

The first to fourth prior art examples have the following shortcomings.

For the first prior art example (the semiconductor device disclosed in U.S. patent application Ser. No. 4,789,648), the point of exposure of the insulating film 104a in the CMP process is the end of the polishing (see FIG. 1B). It is therefore easy to detect the end by a change in electric capacitance.

The interconnection itself has a single-layer structure of Al (Al film 114 or Al alloy) so that a contact with the same kind of metal is made at the interlayer contact portion, resulting in a low contact resistance. But, this first prior art example suffers poor durability with respect to electromigration and stress migration.

The interconnection itself of the first prior art example cannot therefore have high and continuing reliability.

Even if one tries to use a metal, such as Cu or Au, which has a high conductivity and high durability with respect to the electromigration and stress migration to overcome this problem, those metals are difficult to use due to their reaction with silicon dioxide film and their adhesion to insulating film.

For the second prior art example (the semiconductor device disclosed in U.S. patent application Ser. No. 4,944,836), like the first prior art example, the point of exposure of the insulating film in the metal CMP process is the end of the polishing. It is therefore easy to detect the end by a change in electric capacitance.

While the interconnection itself has a single-layer structure of Al film or Al alloy so that a contact with the same kind of metals is made at the interlayer contact portion, resulting in a low contact resistance, this second prior art example suffers poor durability with respect to electromigration and stress migration as per the first prior art example.

In the second prior art example, metal like Cu which reacts with the silicon dioxide film or Au which has poor adhesion with the insulating film cannot be used as an interconnection material.

Further, the structure and process of this example are such that although the stopper used in the polishing process is $Al_2O_3$ having a high dielectric constant (see "the stopper 113 formed of $Al_2O_3$" in FIG. 2A), it remains after the formation of the interconnection, thus increasing the interlayer capacitance. This results in lower electrical performance.

The third prior art example employs such an interconnection structure that the Ta film 106a protects the Cu film 109a (see FIG. 3E), thus ensuring a high durability with respect to electromigration and stress migration.

Further, when Ta as a barrier metal is also removed by polishing, it is easy to detect the end of the polishing.

According to the third prior art example, however, when the interconnection takes a multilevel structure, the interlayer contact hole portion provides a contact with different metals, namely, Cu as a conductive film lying over the lower multilevel interconnection and Ta as a conductive film underlying the upper multilevel interconnection. As a result, the contact resistance becomes higher than the case of the Cu—Cu contact, also increasing the overall electric resistance of the multilevel interconnection, so that the obtained semiconductor device does not have good electrical characteristics.

To form the structure that provides a contact with the same kind of metal at the interlayer contact portion, it is necessary to leave the Ta film 106a in the polishing process and then form the Cu film 109a thereon to provide the interconnection in the third prior art example (see FIGS. 3D and 3E). With Ta left as in this case, the end of the polishing cannot be detected.

In the fourth prior art example (the semiconductor device disclosed in Unexamined Japanese Patent Publication No. Sho 63-207153), the point of exposure of the insulating film in the CMP process for the metal film is the end of the polishing, so that it is easy to detect the end by a change in electric capacitance.

As in the first and second prior art examples, however, the interconnection itself has a single-layer structure of Al (Al film 114 or Al alloy) (see FIG. 4F). While the same kind of metals contact with each other at the interlayer contact portion, resulting in a low contact resistance, this fourth prior art example also suffers poor durability with respect to electromigration and stress migration.

In the fourth prior art example, at the time of forming the interlayer contact hole, a hole of approximately the same width as the interlayer contact hole is formed so that the opening need not be made particularly narrow (see FIG. 4D). If positioning with the positioning pattern is inaccurate, however, the insulating film on the sides of the underlying interconnection is etched so that this etched portion is also filled with metal.

When fine interconnections with a small positioning margin and a narrow interconnection pitch are to be formed, shorting between the interconnections is likely to occur, thus making it difficult to adapt this example to a semiconductor device which has fine design rules.

Further, the structure and process of this fourth example are such that a silicon nitride film having a high dielectric constant is used as the stopper 113 in the polishing process and the stopper 113 remains after the formation of the interconnection (see FIG. 4F), thus increasing the interlayer capacitance. The resultant semiconductor device does not have excellent electric characteristics.

SUMMARY OF THE INVENTION

Accordingly, it is the primary object of the present invention to provide a semiconductor device having a metal interconnection, which overcomes the above-described shortcomings and disadvantages of the first to fourth prior art examples.

It is the second object of this invention to provide a semiconductor device which is highly durable with respect to electromigration and stress migration and has high and long-lasting reliability.

It is the third object of this invention to a semiconductor device which employs such a structure as to allow metals of the same kind to contact each other at the interlayer contact hole portion, thus reducing the contact resistance.

It is the fourth object of this invention to a semiconductor device which permits the end of the polishing process to be precisely detected in the fabrication of an interconnection metal and which has stable electric characteristics and a high yield at the time of fabrication.

To achieve the above objects, according to one aspect of this invention, there is provided a semiconductor device having a metal interconnection that includes:

an insulating film provided on a semiconductor substrate via a diffusion layer;

an interlayer contact hole formed in the insulating film;

a metal silicide layer provided at a bottom of the interlayer contact hole;

a first conductive film having a single or a plurality of metal films provided on the insulating film and the interlayer contact hole;

a second conductive film provided in the interlayer contact hole;

a third conductive film provided on the first conductive film and the second conductive film; and a fourth conductive film provided on the third conductive film.

According to another aspect of this invention, there is provided a semiconductor device having a metal interconnection, which device comprises:

an insulating film provided on a semiconductor substrate via a diffusion layer;

an interlayer contact hole formed in the insulating film;

a metal silicide layer provided at a bottom of the interlayer contact hole;

a first conductive film having a single or a plurality of metal films provided on the insulating film and the interlayer contact hole;

a second conductive film provided in the interlayer contact hole;

a third conductive film provided on the first conductive film and the second conductive film; and a fourth conductive film provided on the third conductive film.

According to the present invention, the semiconductor device embodying this invention has an interconnection structure having high electric conductivity and high durability against electromigration and stress migration, and has an interconnection which is protected against oxidation and corrosion by a high melting-point metal and silicon nitride film.

Further, even when the interconnection has a multilevel structure, the same kind of metals contact each other at the interlayer contact hole portion, thus reducing the contact resistance. This interconnection therefore has improved electric characteristics and improved and continuing reliability than the conventional one.

Furthermore, according to the semiconductor device of this invention, the end of the polishing process can be precisely detected in the fabrication of the interconnection metal, thus ensuring stable electric characteristics and a high yield at the time of fabrication.

DETAILED DESCRIPTION OF THE PREFERRED EMBODIMENTS

Preferred embodiments of the present invention will now be described with reference to the accompanying drawings.

This invention is not limited to the embodiments to be described below, but may be embodied in various other forms without departing from the scope and spirit of the invention.

First Embodiment

Figure 1A:
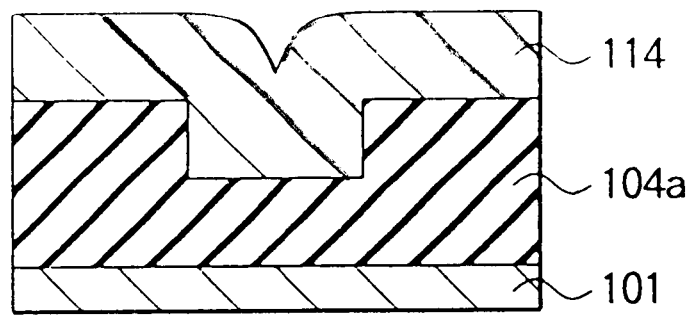
FIGS. 1A and 1B are vertical cross-sectional views for explaining the first prior art example, illustrating the two-step fabrication process for this prior art example.
Figure 1B:
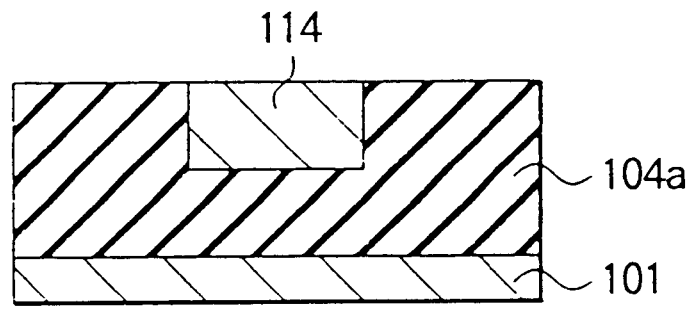
Figure 2A:
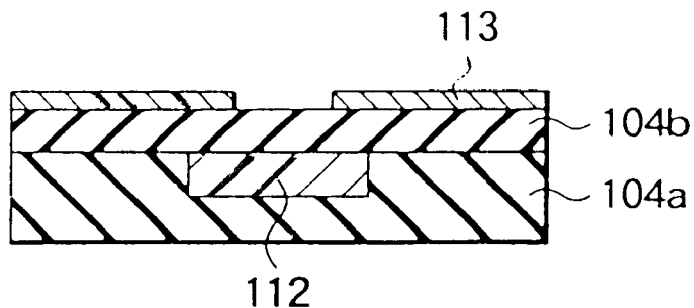
FIGS. 2A through 2E are vertical cross-sectional views for explaining the second prior art example, illustrating the five-step fabrication process for this prior art example.
Figure 2B:
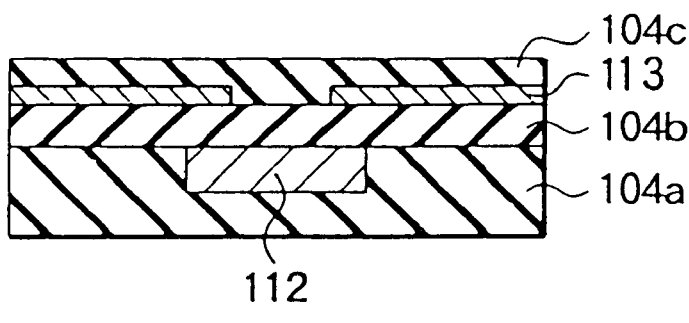
Figure 2C:
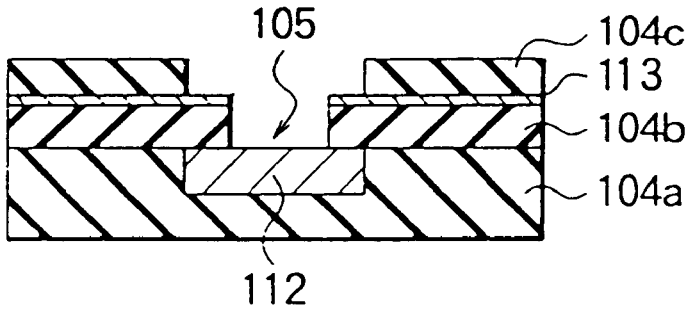
Figure 2D:
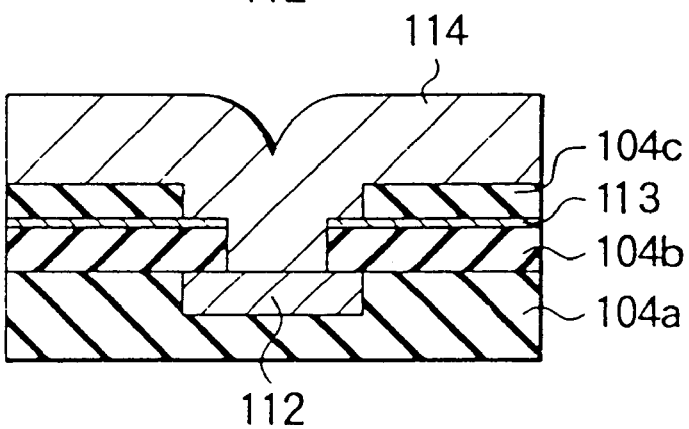
Figure 2E:
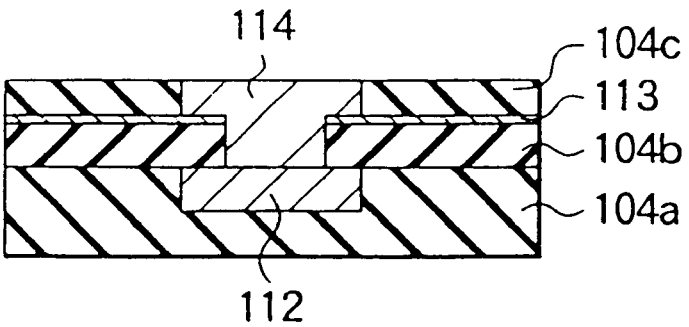
Figure 3A:
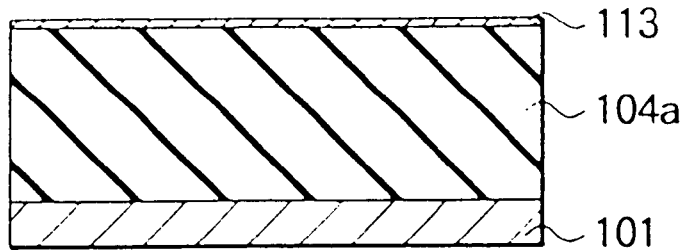
FIGS. 3A through 3E are vertical cross-sectional views for explaining the third prior art example, illustrating the five-step fabrication process for this prior art example.
Figure 3B:
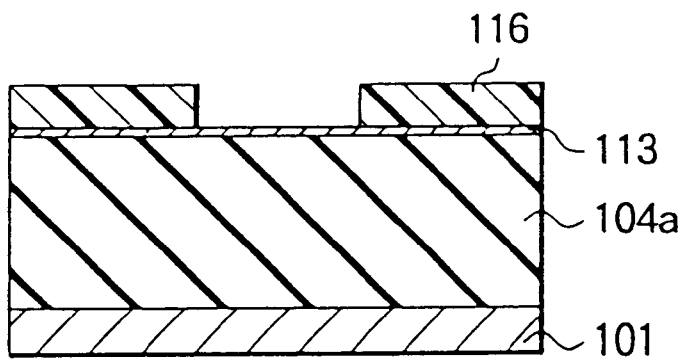
Figure 3C:
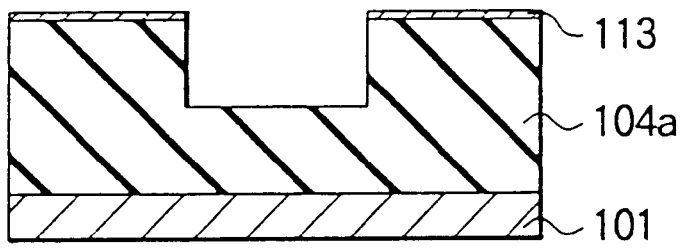
Figure 3D:
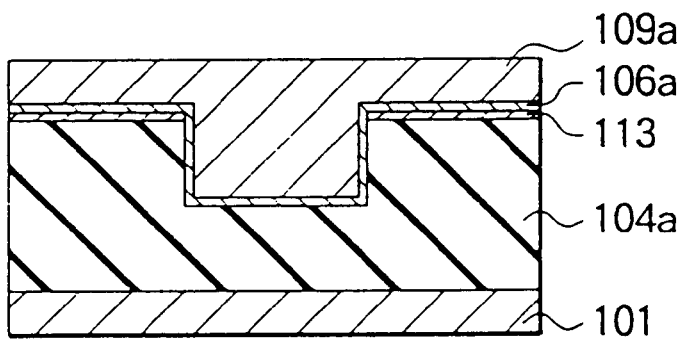
Figure 3E:
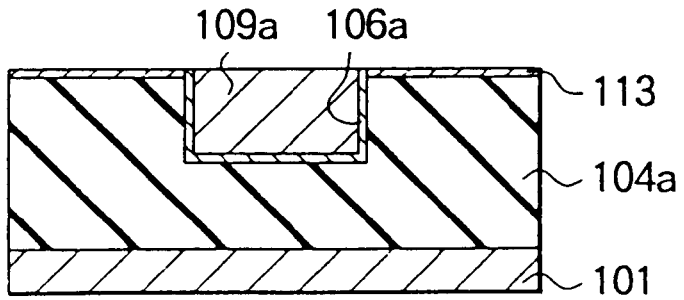
Figure 4A:
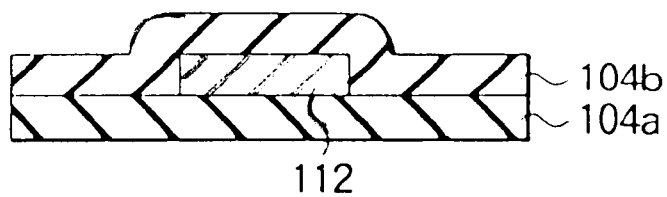
FIGS. 4A through 4F are vertical cross-sectional views for explaining the fourth prior art example, illustrating the six-step fabrication process for this prior art example.
Figure 4B:
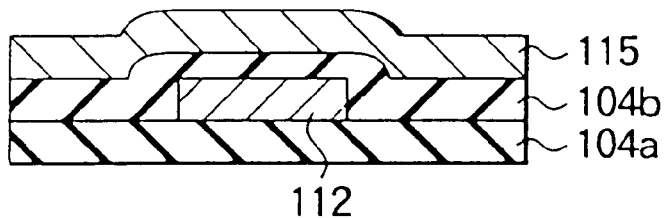
Figure 4C:
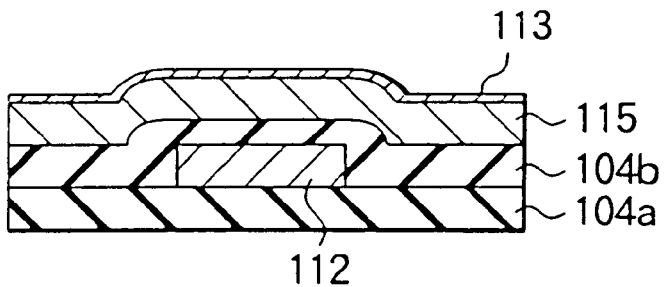
Figure 4D:
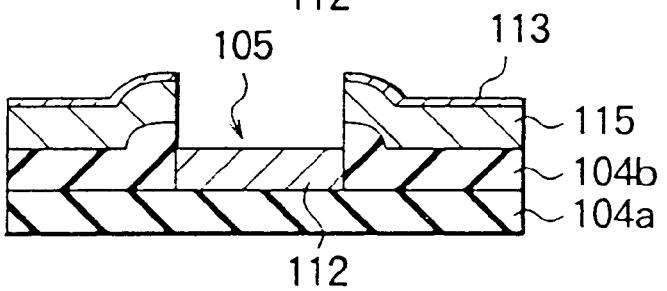
Figure 4E:
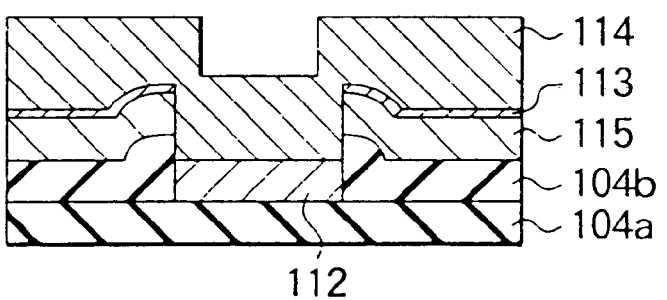
Figure 4F:
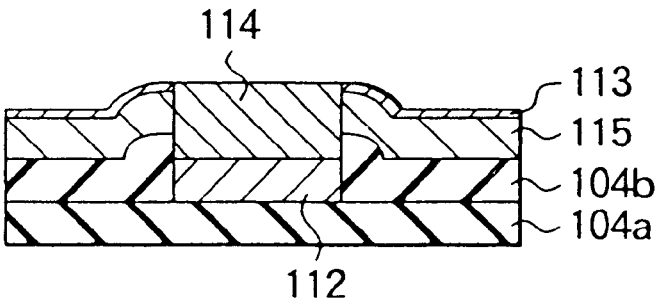
Figure 5A:
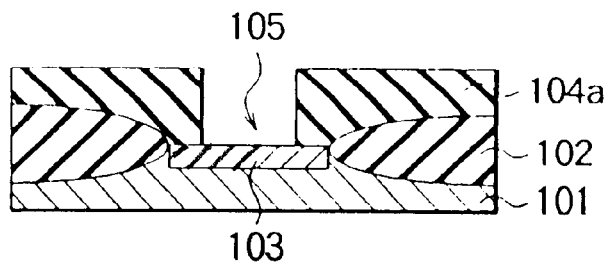
FIGS. 5A through 5F are vertical cross-sectional views for explaining a semiconductor device according to a first embodiment of this invention, illustrating the six-step fabrication process for this semiconductor device.

FIGS. 5A through 5F are vertical cross-sectional views illustrating the step-by-step (six steps) fabrication process for the first embodiment of this invention. In the first embodiment, known techniques such as selective oxidation and ion implantation are used to form a field oxide film 102 and a diffusion layer 103 on a silicon substrate 101 as shown in FIG. 5A.

Next, an insulating film 104a of a silicon dioxide film having a thickness of about 1000 nm is formed on the top of the resultant structure by thermal CVD using monosilane ($SiH_4$) as the source.

In this case, the insulating film 104a should not necessary have a single-layer structure of a silicon dioxide film, but may be a PSG film or BPSG film containing phosphorus (P) or boron (B) or may take a multilayer structure consisting of a silicon dioxide film and a PSG film or a silicon dioxide film and a BPSG film.

Next, an interlayer contact hole 105 reaching the diffusion layer 103 is formed by reactive ion etching using a photoresist (not shown) as a mask, followed by the removable of this photoresist (FIG. 5A).

Figure 5B:
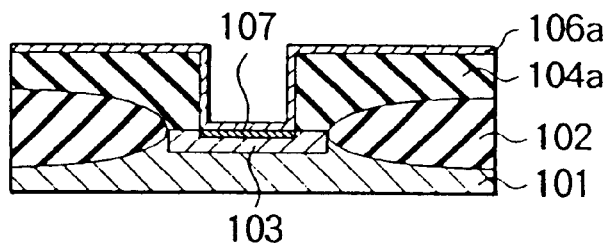

As shown in FIG. 5B, a Ta film 106a as the first conductive film is formed 50 to 150 nm thick by D.C. magnetron sputtering under the conditions of the pressure of 2 to 10 mTorr and the RF power of 1.0 to 5.0 KW.

Then, the resultant structure is subjected to a heat treatment at 600 to 800° C. for 10 to 30 seconds by the rapid heating using a lamp under the non-oxidation atmosphere of nitride ($N_2$) or argon (Ar), allowing the diffusion layer 103 to react with the Ta film 106a and thus forming a silicide film 107 at the interface between the diffusion layer 103 and Ta film 106a (see FIG. 5B).

This silicide film 107 is formed to reduce the contact resistance of the diffusion layer 103 and the Ta film 106a as the first conductive film.

The Ta film 106a as the first conductive film is formed to (1) prevent Cu in a Cu film 109a (see FIG. 5C), which is to be formed on the overlying layer in a later process, from being diffused into the diffusion layer 103, (2) improve the adhesion between the Cu film 109a and the silicon dioxide film (insulating film 104a) as the base insulating film, and (3) improve the durability of the whole interconnection against electromigration and stress migration.

Although the Ta film 106a is used as the first conductive film in the first embodiment, other metals than Ta, such as tungsten (W), molybdenum (Mo), titanium (Ti), zirconium (Zr), hafnium (Hf), vanadium (V), niobium (Nb), chromium (Cr), osmium (Os), cobalt (Co), iridium (Ir), nickel (Ni), palladium (Pd) and platinum (Pt), and alloys containing those elements may also be used.

Figure 5C:
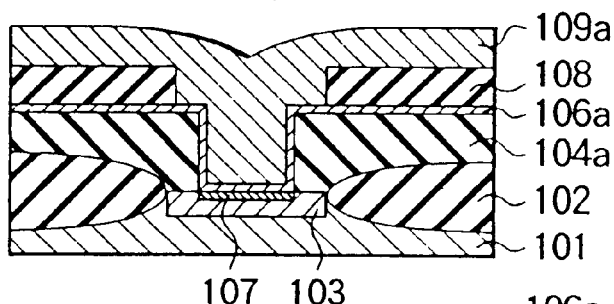

Next, an insulating film mask 108 of a silicon dioxide film is formed by a known plasma CVD technique using $SiH_4$ and dinitrogen monoxide ($N_2O$) as a reaction gas, as shown in FIG. 5C.

This insulating film mask 108 is formed by first forming an insulating film of a silicon dioxide film 200 to 500 nm thick under the conditions of 100 to 300 sccm of $SiH_4$ 500 to 1500 sccm of $N_2O$, the substrate temperature of 300 to 400° C., the pressure of 0.25 to 5.0 Torr and the RF power of 0.25 to 2 KW, and then removing the unnecessary portions by known lithography and dry etching techniques.

The insulating film mask 108 of the silicon dioxide film serves as a stopper layer in polishing the Cu film 109a in the later process (FIG. 5D) which will be discussed in detail later, and also as an end detecting film.

Subsequently, the Cu film 109a as the second conductive film is formed 200 to 1000 nm thick on the Ta film 106a and insulating film mask 108 by known Cu-CVD (Cu-Chemical Vapor Deposition) (FIG. 5C).

The Cu-CVD for forming the Cu film 109a is executed by using as a reaction source gas a compound such as hexafluoroacetylacetonato copper(I) vinyltrimethylsilane (hereinafter abbreviated as "(hfa)Cu(vtms)") or copper bis hexafluoroacetylacetonato (hereinafter abbreviated as "Cu (hfa)$_2$") which has a low decomposition temperature and provides high vapor pressure even at a relatively low temperature, or using hydrogen ($H_2$) or argon (Ar) as a carrier gas, at the temperature of 100 to 300° C. and under the pressure of 0.5 to 20 Torr.

At this time, when the diameter of the interlayer contact hole 105 (see FIG. 5A) is very small, a void may be formed in the interlayer contact hole 105 if the step coverage of the Cu film 109a is poor. It is therefore necessary to execute Cu-CVD under the conditions in which the Cu film 109a exhibits a good step coverage.

When (hfa)Cu(Vtms) or Cu(hfa)$_2$ is used as the source, the Cu film 109a if grown at a relatively low temperature can have an excellent step coverage. According to the first embodiment, therefore, Cu-CVD can be carried out at a relatively low temperature of 100 to 300° C. as mentioned above, preferably at 150 to 200° C.

Although the Cu film 109a (see FIG. 5C) is used as the second conductive film in the first embodiment, besides Ca, aluminum (Al) or an Al-based alloy, gold (Au), copper (Cu) and silver (Ag) or an alloy containing any of the mentioned metals may also be used.

Figure 5D:
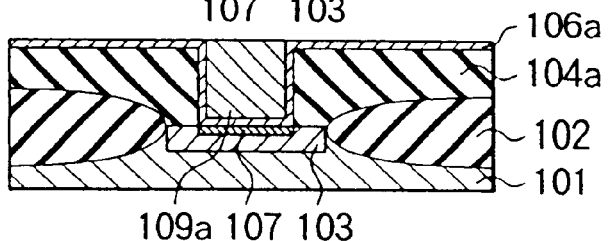

Next, as shown in FIG. 5D, the Cu film 109a and the insulating film mask 108 are polished and removed the Damascene technique, which is one of the CMP techniques, thereby yielding the structure which has the interlayer contact hole 105 filled with the Cu film 109a and has the Ta film 106a exposed at the surface.

At this time, a slurry of pure water to which $Al_2O_3$ particles have been added is used as a polisher, and the conditions such as the rotational polishing speed and applying load are varied depending on the material to be polished and the polishing amount.

Since the end of polishing is detected by a change in electric capacitance of the polished surface in the ordinary CMP technique, the conventional methods have difficulty in finely detecting the polishing end.

According to the first embodiment of this invention, however, because of the presence of the insulating film mask 108 under the Cu film 109a (see FIG. 5C), the electric capacitance temporarily increases when the Cu film 109a is polished to expose the insulating film mask 108, and the electric capacitance rapidly decreases when the insulating film mask 108 is completely polished. By detecting this change in electric capacitance, it is very easy to grasp the polishing stage of the Cu film 109a and detect the end of polishing.

According to the first embodiment, therefore, the polishing can be stopped the instance the Ta film 106a is exposed, preventing the Ta film 106a from being removed. That is, this embodiment can effect polishing with higher controllability than the prior art methods.

Although a silicon dioxide film is used as the insulating film mask 108 in the first embodiment as mentioned earlier, this mask should not necessarily be a silicon dioxide film, but may be a silicon nitride film, silicon oxide nitride film or a polyimide resin film which can provide an electric capacitance.

Figure 5E:
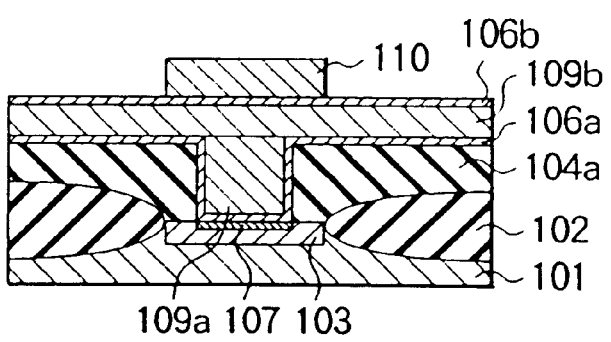

As shown in FIG. 5E, a Cu film 109b as the third conductive film is formed 250 to 500 nm thick by D.C. magnetron sputtering under the conditions of the pressure of 2 to 10 mTorr, the RF power of 1.0 to 5.0 KW, and the substrate temperature of 200 to 400° C., followed by the formation of a Ta film 106b as the fourth conductive film 20 to 500 nm thick on the top of the resultant structure.

The Cu film 109b as the third conductive film will serve as the main conductive film of the interconnection that connects semiconductor devices, and is formed of the same metal as the Cu film 109a as the second conductive film in the first embodiment.

The Ta film 106b as the fourth conductive film is formed to (1) prevent Cu in a Cu film 109b as the third conductive film from being oxidized or corroded, (2) prevent the reaction with the overlying insulating film and improve the adhesion with that insulating film, and (3) improve the durability of the whole interconnection against electromigration and stress migration. In the first embodiment, the Ta film 106b is formed of the same metal as the Ta film 106a as the first conductive film.

Next, an etching mask 110 made of a silicon nitride film is formed 200 to 400 nm thick on the Ta film 106a under the conditions of 100 to 300 sccm of $SiH_4$ 200 to 1200 sccm of ammonia ($NH_3$), the substrate temperature of 300 to 400° C., the pressure of 0.25 to 5.0 Torr and the RF power of 1.0 to 4.0 KW, and then the unnecessary portions are removed to yield the patterned interconnection by known lithography and dry etching techniques (see FIG. 5E).

Figure 5F:
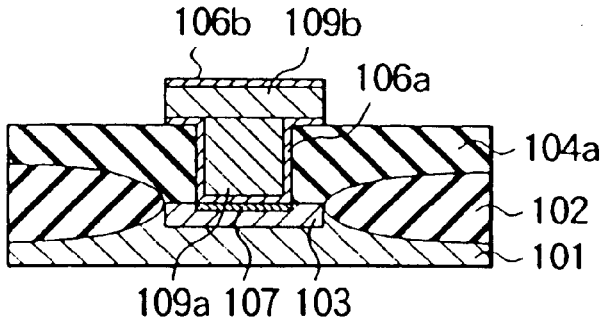

Then, as shown in FIG. 5F, the Ta film 106b, the Cu film 109b and the Ta film 106a are sequentially etched to pattern the interconnection by the reactive ion etching using silicon tetrachloride ($SiCl_4$), chlorine ($Cl_2$), $NH_3$ and $N_2$ under the conditions of the temperature of 280° C., the pressure of 2 Pa, 20 sccm of $SiCl_4$, 20 sccm of $Cl_2$, 10 to 30 sccm of $NH_3$, 80 sccm of $N_2$, and the RF power of 200 KW.

At this time, a product whose composition is close to that of the silicon nitride film produced during the etching reaction adheres to the side walls of the interconnection and this product serves to prevent side etching and corrosion.

Because the interlayer contact hole and the interconnection are connected by the same kind of metal in the semiconductor device according to the first embodiment fabricated by the above-described processes, the contact resistance between the contact hole and the interconnection is lower than that of conventional semiconductor devices, thus ensuring excellent electric characteristics.

Because the Ta film having a high melting point is located above and under the interconnection and the product whose composition is close to that of the silicon nitride film is present on the side walls of the interconnection in the semiconductor device of first embodiment, the oxidation and corrosion of the Cu film as the main conductive film can be suppressed, thus allowing the interconnection to have high and continuing reliability.

Further, the groove-buried interconnection facilitates making the interconnection thicker, and it is easy to reduce its resistance.

The semiconductor device of the first embodiment can be adapted for various kinds of semiconductor devices, such as MOS transistors and bipolar transistors, as well as various circuits like memory and logic. This invention therefore includes various kinds of semiconductor devices and circuits and are not limited to any particular type.

FIGS. 6A through 6E are vertical cross-sectional views for explaining a semiconductor device according to the second embodiment of this invention, illustrating the step-by-step (five steps) fabrication process for this semiconductor device.

Figure 6A:
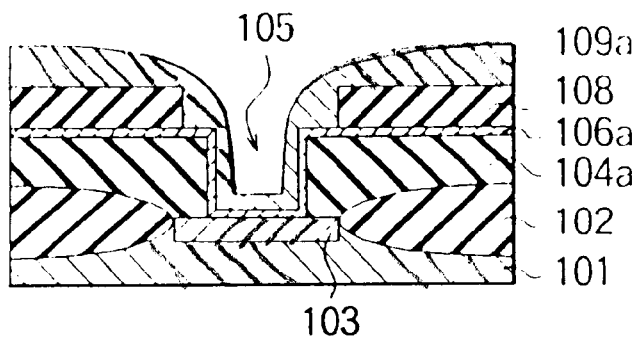
FIGS. 6A through 6E are vertical cross-sectional views for explaining a semiconductor device according to a second embodiment of this invention, illustrating the five-step fabrication process for this semiconductor device.

According to the second embodiment, a silicon substrate 101, a field oxide film 102, a diffusion layer 103 and an insulating film 104a are formed first, and then a interlayer contact hole 105 reaching the diffusion layer 103 via the insulating film 104a is formed, as shown in FIG. 6A. Those are formed by using the same techniques, methods and materials as used in the first embodiment.

Next, a Ta film 106a as the first conductive film is embodiment.

Next, a Cu film 109a as the second conductive film is formed 200 to 500 nm thick on the Ta film 106a and the insulating film mask 108 by D.C. magnetron sputtering under the conditions of the substrate temperature of 450 to 600° C., the pressure of 2 to 10 mTorr and the RF power of 3.0 to 8.0 KW (FIG. 6A).

Although the Ta film 106a and the Cu film 109a are used in the second embodiment, metals other than tantalum (Ta), such as tungsten (W) and molybdenum (Mo), may be used, and other metals than copper (Cu), such as aluminum (Al) or an Al-based alloy and gold (Au), may be used as well.

Figure 6B:
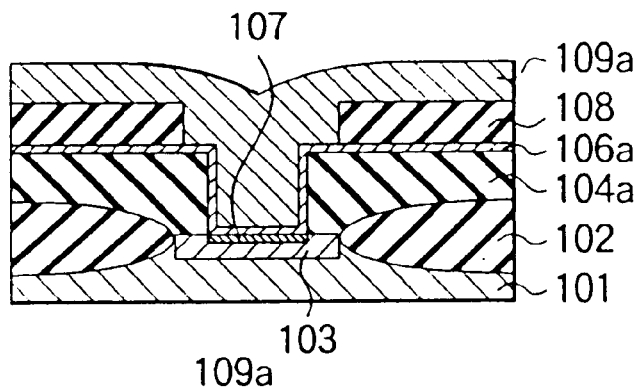

As shown in FIG. 6B, a heat treatment is performed at 50 to 700° C. for 30 to 120 seconds without breaking the vacuum condition at the time of sputtering the Cu film, thereby causing the Cu film 109a to flow to fill up the interlayer contact hole 105. At this time, the Ta film 106a reacts with the diffusion layer 103 to form a silicide film 107.

As the sputtering employed in the second embodiment has a poorer step coverage than the Cu-CVD technique used in the first embodiment, the filling factor of the Cu film 109a into the interlayer contact hole 105 becomes lower. But, the vacuum heat treatment allows the Cu film 109a to sufficiently fill up the interlayer contact hole 105.

Figure 6C:
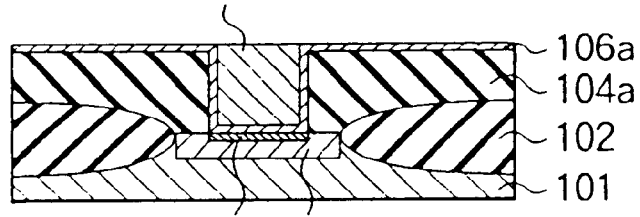

Next, as shown in FIG. 6C, the Cu film 109a and the insulating film mask 108 are polished and removed by the Damascene technique, which is one of the CMP techniques, thereby yielding the structure which has the interlayer contact hole 105 filled with the Cu film 109a and has the Ta film 106a exposed at the surface.

At this time, pure water to which $Al_2O_3$ particles have been added is used as a polishing slurry, and the conditions such as the rotational polishing speed and applying load are varied depending on the material to be polished and the polishing amount.

Since the end of polishing is detected by a change in electric capacitance of the polished surface in the ordinary CMP technique, conventional methods have a difficulty in finely detecting the polishing end.

According to the second embodiment of this invention, however, because of the presence of the insulating film mask 108 under the Cu film 109a (see FIG. 6B), the electric capacitance temporarily increases when the Cu film 109a is polished to expose the insulating film mask 108, and the electric capacitance rapidly decreases when the insulating film mask 108 is completely polished. By detecting this change in electric capacitance, it is very easy to grasp the polishing stage of the Cu film 109a and detect the end of polishing.

According to the second embodiment, therefore, the polishing can be stopped the instant the Ta film 106a is exposed, preventing the Ta film 106a from being removed. That is, this embodiment can effect polishing with higher controllability than the prior art methods.

Although a silicon dioxide film is used as the insulating film mask 108 in the second embodiment, this mask should not necessarily be a silicon dioxide film, but may be a silicon nitride film or a polyimide resin film which can provide an electric capacitance.

Figure 6D:
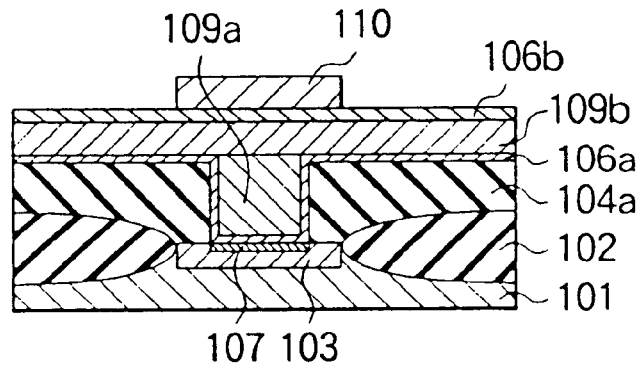

As shown in FIG. 6D, a Cu film 109b as the third conductive film is formed 250 to 500 nm thick by D.C. magnetron sputtering under the conditions of the pressure of 2 to 10 mTorr, the RF power of 1.0 to 5.0 KW, and the substrate temperature of 200 to 400° C., followed by the formation of a Ta film 106b as the fourth conductive film 20 to 50 nm thick on the top of the resultant structure.

The Cu film 109b as the third conductive film will serve as the main conductive film of the interconnection hat connects between semiconductor devices, and is formed of the same metal as the Cu film 109a used as the second conductive film in the second embodiment.

The Ta film 106b as the fourth conductive film is formed to (1) prevent Cu in a Cu film 109b as the third conductive film from being oxidized or corroded, (2) prevent reaction with the overlying insulating film and improve adhesion with that insulating film, and (3) improve the durability of the whole interconnection against electromigration and stress migration. In the first embodiment, the Ta film 106b is formed of the same metal used as the Ta film 106a as the first conductive film.

Next, an etching mask 110 made of a silicon nitride film is formed 200 to 400 nm thick on the Ta film 106a under the conditions of 100 to 300 sccm of $SiH_4$, 200 to 1200 sccm of $NH_3$, the substrate temperature of 300 to 400° C., the pressure of 0.25 to 5.0 Torr and the RF power of 1.0 to 4.0 KW, and then the unnecessary portions are removed to yield the patterned interconnection by known lithography and dry etching techniques (see FIG. 6D).

Figure 6E:
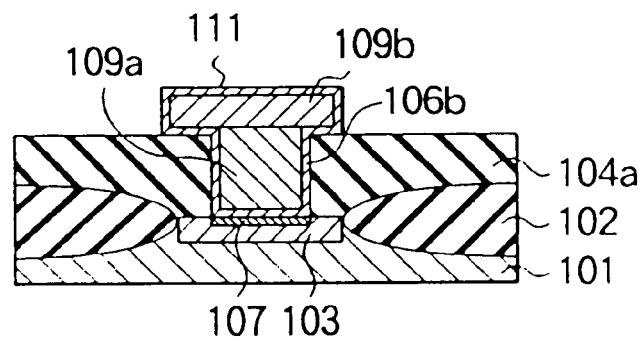

Then, as shown in FIG. 6E, the Ta film 106b, the Cu film 109b and the Ta film 106a are sequentially etched to pattern the interconnection by reactive ion etching using $SiCl_4$, $Cl_2$, $NH_3$ and $N_2$ under the conditions of the temperature of 280° C., the pressure of 2 Pa, 20 sccm of $SiCl_4$, 20 sccm of $Cl_2$, 10 to 30 sccm of $NH_3$, 80 sccm of $N_2$, and the RF power of 200 KW.

Further, the etching mask 110 and Ta film 106b on top of the Cu film 109b and a reaction product whose composition is close to that of the silicon nitride film adhered to the side walls of the Ta film 106b, the Cu film 109b and the Ta film 106a are removed by reactive ion etching using a fluorine gas such as $CF_4$ or $CHF_3$.

The etching conditions should be selected in such a manner that the ratio of the etching speed of the silicon nitride film (etching mask 110) to the etching speed of the silicon dioxide film (insulating film 104a) is high and the silicon dioxide film (insulating film 104a) is hardly etched.

Then, a W film 111 having a thickness of 15 to 20 nm is selectively formed only around the interconnection (Cu film 109b) by the selective W-CVD technique using hydrogen as a reducing agent (FIG. 6E).

This selective growth of W is performed under the conditions: the temperature of 350 to 400° C., the pressure of 20 to 80 mTorr, 0.5 to 1.0 sccm of tungsten hexafluoride ($WF_6$), and 200 to 400 sccm of $H_2$. Under the conditions, depending on the ratio of the exposure of the metal film on the wafer, a slow W growth speed of about 5 to 7 nm/min is acquired, so that controlling the thickness of the W film is easy.

The W film 111 in the second embodiment is formed to protect the interconnection against corrosion and oxidation.

To obtain good selectivity in growing the W film 11, the following two pre-treatments should be performed.

First, a pretreatment with a thin hydrofluoric solution is performed to eliminate damage to the surface of the insulating film 104a caused during etching the Cu film 109b and insulating film mask 108.

The other pretreatment uses a Cu-dissoluble solution such as thin sulfuric acid, and this treatment cleans the surface of the Cu film 109b.

Because the interlayer contact hole and the interconnection are connected by the same kind of metal in the semiconductor device according to the second embodiment fabricated by the above-described five step process, the contact resistance between the contact hole and the interconnection is lower than that of conventional semiconductor devices, thus ensuring excellent electric characteristics, as per the first embodiment.

Because the Ta film 106a having a high melting point is located above and under the interconnection and the W film covers the interconnection, the oxidation and corrosion of the Cu film as the main conductive film can be suppressed, thus allowing the interconnection to have high and continuing reliability.

Further, the groove-buried interconnection facilitates making the interconnection thicker, and it is easy to reduce its resistance.

The semiconductor device of the second embodiment, like that of the first embodiment, can be adapted for various kinds of semiconductor devices, such as MOS transistors and bipolar transistors, as well as various circuits like memory and logic.

What is claimed is:

1. A semiconductor device having a metal interconnection, said metal interconnection including:

an insulating film provided on a semiconductor substrate via a diffusion layer;

an interlayer contact hole formed in said insulating film;

a metal silicide layer provided at a bottom of said interlayer contact hole;

a first conductive film, comprising at least one metal film, provided on said insulating film and said interlayer contact hole;

a second conductive film provided in said interlayer contact hole;

a third conductive film provided on said first conductive film and said second conductive film; and a fourth conductive film provided on said third conductive film.

2. A semiconductor device having a metal interconnection, comprising:

an insulating film provided on a semiconductor substrate via a diffusion layer;

an interlayer contact hole formed in said insulating film;

a metal silicide layer provided at a bottom of said interlayer contact hole;

a first conductive film, comprising at least one metal film, provided on said insulating film and said interlayer contact hole;

a second conductive film provided in said interlayer contact hole;

a third conductive film provided on said first conductive film and said second conductive film; and a fourth conductive film provided on said third conductive film.

3. The semiconductor device according to claim 1, wherein said first conductive film comprises at least one metal film of at least one type of material selected from the group consisting of titanium (Ti), zirconium (Zr), hafnium (Hf), vanadium (V), niobium (Nb), tantalum (Ta), chromium (Cr), molybdenum (Mo), tungsten (W), osmium (Os), cobalt (Co), iridium (Ir), nickel (Ni), palladium (Pd), platinum (Pt), and alloys and compounds containing those elements.

4. The semiconductor device according to claim 1, wherein said second conductive film and said third conductive film are formed of at least one type of material selected from the group consisting of aluminum (Al), copper (Cu), silver (Ag), gold (Au), and alloys containing those elements.

5. The semiconductor device according to claim 1, wherein said fourth conductive film is formed of at least one type of material selected from group consisting of titanium (Ti), zirconium (Zr), hafnium (Hf), vanadium (V), niobium (Nb), chromium (Cr), molybdenum (Mo), tungsten (W), and alloys and compounds containing those elements.

6. The semiconductor device according to claim 1, wherein said first conductive film and fourth conductive film are formed of the same material, and said second conductive film and third conductive film are formed of the same material.

7. The semiconductor device according to claim 2, wherein said first conductive film comprises at least one metal film of at least one type of material selected from the group consisting of titanium (Ti), zirconium (Zr), hafnium (Hf), vanadium (V), niobium (Nb), tantalum (Ta), chromium (Cr), molybdenum (Mo), tungsten (W), osmium (Os), cobalt (Co), iridium (Ir), nickel (Ni), palladium (Pd), platinum (Pt), and alloys and compounds containing those elements.

8. The semiconductor device according to claim 2, wherein said second conductive film and said third conductive film are formed of at least one type of material selected from the group consisting of aluminum (Al), copper (Cu), silver (Ag), gold (Au), and alloys containing those elements.

9. The semiconductor device according to claim 2, wherein said fourth conductive film is formed of at least one type of material selected from the group consisting of titanium (Ti), zirconium (Zr), hafnium (Hf), vanadium (V), niobium (Nb), chromium (Cr), molybdenum (Mo), tungsten (W), and alloys and compounds containing those elements.

10. The semiconductor device according to claim 2, wherein said first conductive film and fourth conductive film are formed of the same material, and said second conductive film and third conductive film are formed of the same material.

11. The semiconductor device according to claim 1, wherein said second conductive film is disposed substantially entirely within said interlayer contact hole, and said third and fourth conductive films are disposed substantially entirely outside said interlayer contact hole.

12. The semiconductor device according to claim 2, wherein said second conductive film is disposed substantially entirely within said interlayer contact hole, and said third and fourth conductive films are disposed substantially entirely outside said interlayer contact hole.

13. The semiconductor device according to claim 11, wherein said third conductive film has a top surface and a plurality of side surfaces, wherein said fourth conductive film is provided on said top surface of said third conductive film, and wherein said metal interconnection further comprises a fifth conductive film provided on said side surfaces of said third conductive film.

14. The semiconductor device according to claim 12, wherein said third conductive film has a top surface and a plurality of side surfaces, wherein said fourth conductive film is provided on said top surface of said third conductive film, and wherein said metal interconnection further comprises a fifth conductive film provided on said side surfaces of said third conductive film.

* * * * *

UNITED STATES PATENT AND TRADEMARK OFFICE
CERTIFICATE OF CORRECTION

PATENT NO.    : 6,274,932 B1                                             Page 1 of 1
DATED         : August 14, 2001
INVENTOR(S)   : Mikagi, Kaoru It is certified that error appears in the above-identified patent and that said Letters Patent is hereby corrected as shown below:

<u>Column 9,</u>
Line 36, delete "Next, a Ta film 106a as the first conductive film is embodiment". insert -- Next, a Ta film 106a as the first conductive film is formed 50 to 150 nm thick by D.C. magnetron sputtering under the conditions of the pressure of 2 to 10 mTorr and the RF power of 1.0 to 5.0 KW, and then an insulating film mask 108 of a silicon dioxide film is formed as per the first embodiment --.

Signed and Sealed this

Sixteenth Day of July, 2002

*Attest:*

JAMES E. ROGAN
*Attesting Officer*            *Director of the United States Patent and Trademark Office*